United States Patent [19]

Waehner

[11] 4,142,134
[45] Feb. 27, 1979

[54] DIRECT INTEGRATION YOKE DRIVER FOR A HIGH SPEED ALPHANUMERIC DISPLAY SYSTEM

[75] Inventor: Glenn C. Waehner, Riverside, Conn.

[73] Assignee: United Technologies Corporation, Hartford, Conn.

[21] Appl. No.: 810,652

[22] Filed: Jun. 27, 1977

[51] Int. Cl.$^2$ .......................................... H01J 29/70
[52] U.S. Cl. ................................. 315/387; 315/367; 315/388
[58] Field of Search ..................... 315/367, 387, 388

[56] References Cited

U.S. PATENT DOCUMENTS

| | | | |
|---|---|---|---|
| 3,515,933 | 6/1970 | Myers | 315/387 |
| 3,757,155 | 9/1973 | Waehner | 315/387 |
| 3,859,557 | 1/1975 | Grant et al. | 315/387 |
| 3,935,529 | 1/1976 | Kalmanash et al. | 315/387 X |
| 3,965,390 | 6/1976 | Spencer, Jr. | 315/387 X |
| 3,983,452 | 9/1976 | Bazin | 315/387 X |
| 4,001,806 | 1/1977 | Sweeting | 315/367 X |

Primary Examiner—Malcolm F. Hubler
Attorney, Agent, or Firm—Richard P. Lange

[57] ABSTRACT

A high speed driver circuit for the magnetic deflection yoke of an orthogonal channel displaying high speed alphanumeric characters, or the like, includes a first input receiving a stored signal proportional to the derivative of the vector slope component and a second input receiving a positive feedback from the yoke sense resistor. At high frequencies the yoke current is primarily inductive so that the voltage across the yoke is proportional to the rate of change of current through the yoke, hence, this voltage, when properly connected by positive feedback, is also proportional to the derivative of the voltage across the magnetic deflection yoke. By combining this voltage waveform directly within the vector slope signal, the need for an active integrator in the closed loop driving the magnetic deflection yoke is eliminated.

8 Claims, 3 Drawing Figures

DIRECT INTEGRATION YOKE DRIVER FOR A HIGH SPEED ALPHANUMERIC DISPLAY SYSTEM

BACKGROUND OF THE INVENTION

1. Field of the Invention

This invention relates to a high speed yoke driver for the magnetic deflection yoke of a stroke-write display system, and more particularly, to a circuit for driving the deflection yoke of one orthogonal channel of a CRT in which a signal, derived from the integration of the yoke drive current by the yoke inductance, is combined with the vector slope signal component, and is then impressed directly on the deflection yoke thereby enhancing the effective bandwidth of the driving channel.

2. Description of the Prior Art

In stroke-write systems utilizing a CRT (cathode ray tube), the desired information such as alphanumeric characters, is displayed on the CRT faceplate by a series of rapid straight-line strokes of the electron beam similar to the method by which a pen or pencil generates characters on a piece of paper. A stroke vector has a pair of orthogonal components which are proportional to the magnet flux field generated by the horizontal and vertical deflection coils. To display alphanumeric characters, these magnetic flux fields must change at high rates thereby requiring corresponding high speed electrical signals to be applied to the magnetic deflection yokes.

A limitation of the high speed capability of prior art stroke-write systems has been the bandpass characteristic of the channel through which the yoke deflection current is derived. In the generation of alphanumeric characters on the faceplate of a CRT, it is known that the generation of good quality alphanumeric characters requires an effective channel bandwidth which is capable of passing approximately the 7th to 8th harmonic of the electrical signal wave driving the magnetic deflection system. Acceptable alphanumeric characters can be generated if the effective channel bandwidth passes signals through the 5th harmonic of the deflection signal waveform but the sharp corners of the characters tend to be rounded causing each individual character to be somewhat harder to identify. Where the effective channel bandwidth only has the capability of passing the 3rd harmonic of the deflection signal waveform, the characters on the CRT faceplate are significantly rounded and it becomes difficult to identify specific characters. Accordingly, in order to increase the high speed capability of the stroke-write system while still maintaining an acceptable level of character reproduction on the CRT faceplate, it is essential that the effective bandwidth of a driver circuit for the horizontal and vertical deflection yokes being increased to the point where they effectively reproduce the 7th to 8th harmonic of the slope vector component.

In some prior art stroke-write display systems, character information is stored in digital form until gated into the deflection channel for generation of the specific character. Separate storage for the horizontal and vertical signal may be provided and this stored information is periodically presented to the respective channels as required. Since the driver circuits for a magnetic deflection yoke are analog devices, the digital signal representing the vector slope is fed to a D/A converter where an analog equivalent of the stored digital information is derived. Deflection yokes require large current to generate the requisite amount of magnetic flux necessary for beam deflection, and one technique for a current generation has involved the use of a voltage follower power amplifier with negative feedback for DC stability. The analog signal representing character slope is typically a high frequency signal, i.e. above 4 megahertz and is integrated and combined with a low frequency, i.e. below 4 megahertz, to make the composite sweep signal which is then applied to the power amplifier. The output signal from the power amplifier is fed to the respective deflection yoke for deflection of the electron beam in either the horizontal or vertical direction.

U.S. Pat. No. 4,001,806 issued Jan. 4, 1977 to C. Sweeting, assigned to the same assignee, discloses a constant speed stroke-write vector display system of the type heretofore described. As illustrated, in FIG. 1, analog signal representing character slope information is fed to an integration circuit to generate a signal waveform, which when combined with positional information in a summing circuit, is suitable for driving a deflection amplifier. The most significant limitation of this circuit in the production of high speed high quality alphanumeric characters is the effective bandwidth of the integrator and deflection amplifier.

Of general interest are U.S. Pat. No. 3,757,155 issued Sept. 4, 1973 to the present inventor and U.S. Pat. No. 3,515,933 issued June 2, 1970 to J. P. Meyer. Both of these patents describe a circuit configuration which provide some compensation for the high and low frequency characteristics of a deflection yoke thereby improving the overall linearity of the closed loop deflection amplifier.

SUMMARY OF THE INVENTION

The object of the present invention is to provide a high speed yoke driver circuit suitable for a stroke-write alphanumeric display system.

According to a feature of the present invention, a signal proportional to the current through a magnetic deflection yoke is combined with an analog character slope signal, i.e. the character slope derivative, to create a signal waveform suitable for driving the deflection yoke. At high frequencies the current through the deflection yoke is proportional to the integral of the voltage across the yoke. By sensing this signal and applying it to a feedback path, the need for an integrating operational amplifier or a high gain-bandwidth deflection amplifier, whose bandpass characteristic would tend to limit the high speed capability of the deflection channel, is eliminated.

A primary advantage of the present invention is that the effective bandwidth of the channel driving a magnetic deflection yoke is enhanced by the use of direct integration, i.e. the relationship between the current and voltage in a perfect inductance, rather than integration by an active device, i.e. an operational amplifier integrator, since the magnetic deflection yoke is removed from the high frequency feedback loop. The use of the yoke inductance to integrate an input signal rather than integration by an operational amplifier is significant for a number of reasons. A stable operational amplifier integrator significantly attenuates the input signal and thus there must be a corresponding high open loop amplification in the deflection amplifier to generate an output signal for driving the magnetic deflection yoke. By removing the magnetic deflection yoke from the high frequency feedback loop, a much less expensive deflection amplifier with a lower gain bandwidth product can be used. Additionally, the need for compensation to reduce ringing is minimized.

DETAILED DESCRIPTION OF THE EMBODIMENT

The present invention is predicated on the recognition that in stroke-write systems for displaying alphanumeric characters, or the like, the signal presented to each orthogonal channel of the CRT deflection circuitry has a low frequency component, which primarily represents a vector position, and a high frequency component, which primarily represents vector character slope. In addition, in prior art systems the stored analog signal presented to the magnetic deflection channel often included an active integrator, i.e. an operational amplifier integrator, so that the rate of change of this input signal would be proportional to the vector slope displayed on the CRT faceplate. Since it is well known to those of ordinary skill that the voltage across a perfect inductance is directly proportional to the rate of change in current through the inductance, the simple, but unique, circuit configuration of the present invention allows a signal indicative of the inductive current in the magnetic deflection yoke to be used as a source to provide a waveform representing the voltage which must be impressed on the yoke to produce this inductive current.

Figure 1:
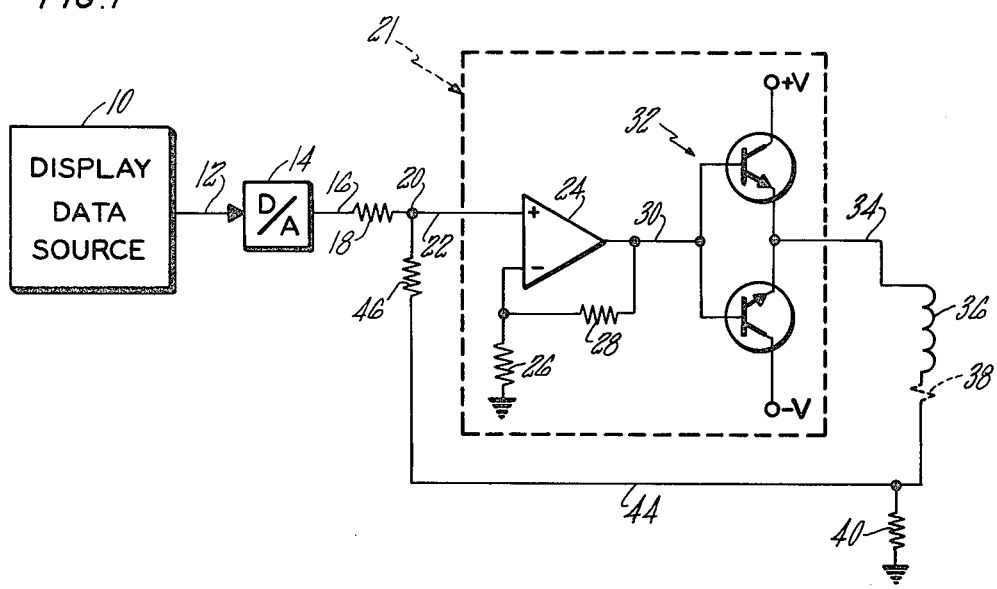
FIG. 1 is a schematic diagram of a yoke driver circuit according to the present invention for driving a magnetic yoke.

Referring initially to FIG. 1, one of the two orthogonally related magnetic deflection channels, which together produce high speed characters according to the teachings of the present invention, will now be described. Stroke vector information is stored in display data source 10 in a digital format. Display data source 10 is normally a part of a more comprehensive system, such as a read-out device for a computer terminal or other similar system, and would most likely include additional output which are fed to various parts of the CRT display system, i.e. video blanking circuit, etc. On command, display data source 10 provides a digital signal indicative of the character slope of the vector to be displayed on the CRT to line 12 and a D/A (digital-to-analog) converter 14. The D/A converter 14 changes the digital input signal to an analog signal representing the vector slope or rate of change of the displayed vector related to this orthogonal channel. The output of the D/A converter 14 is connected by a line 16 to a scaling impedance, resistor 18, and a summing node 20. From the summing node 20 the signal is presented to the input of a power amplification stage 21.

Power amplification devices for driving magnetic deflection yokes are well known to those of ordinary skill and, in preferred form, power amplification stage 21 is connected by line 22 to receive the signal at the summing node 20. The input device of power amplification stage 21 is a high gain operational amplifier 24 with its non-inverting input connected to line 22. The operational amplifier 24 has a resistor 26 shunted to ground from its inverting input while resistor 28 is strapped between the inverting input and the amplifier output terminal. The value of resistors 26 and 28 are selected such that the gain around the closed loop is approximately 20.

Also provided in the power amplification stage 21 is an output stage 32 which is connected to the input stage by line 30. The output stage 32 is a conventional high current gain device which produces an output current waveform suitable for driving a magnetic deflection yoke. As illustrated, it may be comprised of a complimentary pair of transistors situated in a stacked configuration to respond as an "emitter follower." The output of power amplifier stage 21 is connected by line 34 to one side of a magnetic deflection yoke 36, one of the two orthogonal magnetic deflection yokes of the CRT (not shown). The distributed resistance of magnetic deflection yoke 36, which is the resistance of the wire forming the winding, is illustrated by a series coupled resistor 38. A sense resistor 40 is connected between magnetic deflection yoke 36 and ground.

As indicated hereinbefore, an important aspect of the present invention is that it utilizes the inherent phase relationship between voltage and current in an inductance as an integrator. This is possible by sensing the current flowing through the magnetic deflection yoke 36 and compensating the yoke driver circuit for the error introduced by the resistive portion of this current so that the voltage impress across the yoke is directly proportional to the derivative of the vector slope component, this also being proportional to the rate of change in inductive current through the deflection yoke. This can be more fully appreciated from the following equation:

$$V_{36} = L\, di/dt + I_{36}(R_{38} + R_{40})$$

Where:
  $V_{36}$ is the voltage impressed on magnetic deflection yoke 36;
  L is the inductance of magnetic deflection yoke 36;
  di/di is the rate of change of current with respect to time;
  $I_{36}$ is the current through magnetic deflection yoke;
  $R_{38}$ is the distributed resistance of magnetic deflection yoke 36; and,
  $R_{40}$ is the resistance value of sense resistor 40.

It will be noted from this equation that the error which prevents the voltage waveform from being directly proportional to the derivative of the current waveform, i.e. a perfect integrator, is the resistance current. It follows, then, that by compensating for this resistive current, the error is minimized so that the yoke inductance can be used to integrate the slope data directly. Accordingly, the yoke driver circuit of the present invention compensates the input signal, i.e. from the display data source 10, for this error by means of positive feedback. This positive feedback is provided by a line 44 connected atop sense resistor 42 which feeds the signal thereon scaled by resistor 46 to the summing node 20. Those of ordinary skill will appreciate that a combining means for the signals presented to the summing node is created by its direct connection to the non-inverting input of a high voltage gain device, the operational amplifier 24, and that these signals are combined in accordance with the values of resistor 18 and resistor 46.

As is also apparent, but for the magnetic deflection itself, there is no integrator in the loop. In prior art systems, the gain-bandwidth product of any active integrator and that of the closed loop deflection amplifier tends to be the most significant limitation on the high speed capability of heretofore known yoke driver circuit configurations. However, without this limitation, the yoke driver circuit of the present invention has demonstrated an effective bandpass capability of three to four times that of prior art configurations employing an active integrator and closed loop amplifier with a combined bandwidth in the range of 3 megahertz. Although it should be understood that one method of enhancing the bandpass capability of prior art yoke drivers employing an active integrator and closed loop deflection amplifier would be to increase the gain bandwidth product of the amplifiers, this is either beyond the state of the art or a much more expensive procedure when compared to the present invention which integrates directly through the yoke inductance and eliminates the attenuation and bandwidth loss in the active integrator.

Thus far, the yoke driver circuit configuration of the present invention has been described in conjunction with FIG. 1 which illustrates the basic operation of direct character integration by the yoke inductance. It has been found that this configuration is well suited to the situation where alphanumeric characters are displayed on the CRT faceplate at high writing speeds, i.e. above 4 megahertz. However, at slower writing speeds a stroke-write system incorporating this yoke drive circuit illustrates an increasing tendency toward positional instability which causes character distortion. This is because at the lower frequencies, the open loop nature of this basic yoke driver causes it to have poor direct current stability and low frequency response. Accordingly, in order to maintain the high writing speed capability of the basic yoke driver circuit configuration according to the invention, and yet to improve the DC response, a dual channel circuit has been developed.

Figure 2:
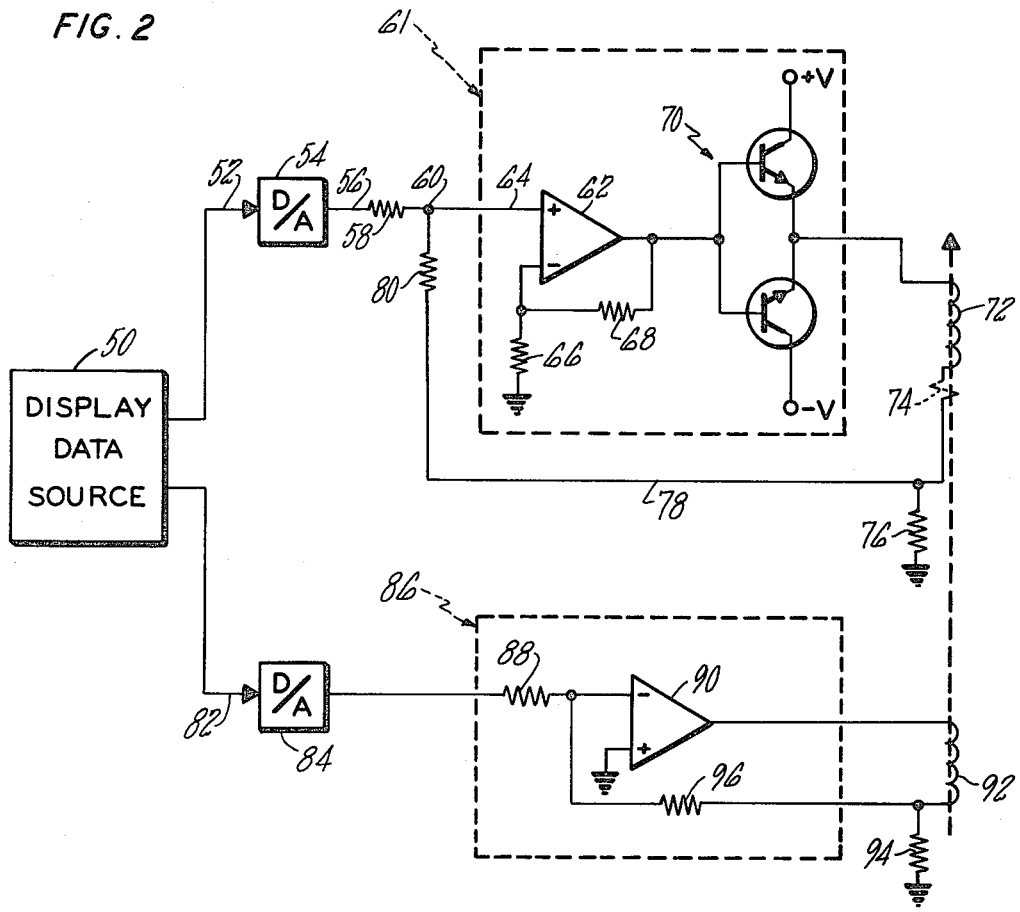
FIG. 2 is a schematic diagram of a second embodiment of a yoke driver circuit according to the present invention with electrically isolated low and high frequency channels for improved low frequency response and DC stability.

Referring now to FIG. 2, the second embodiment of a yoke driver configuration according to the present invention is illustrated. This particular circuit configuration has the same high speed capability of the heretofore described basic yoke drive circuit but has been modified to enhance its low frequency response. With this particular embodiment, the respective horizontal and vertical drive circuits each have a pair of magnetic deflection yokes, each pair of yokes creating coacting magnetic flux fields. Accordingly, the electron beam of the CRT is deflected by the composite field of generated magnetic flux, this being the vectorial sum of the flux fields generated by each magnetic deflection yoke. Such deflection yokes are generally well known in the art and are often referred to as "diddle yoke." Of course, two independent yokes could also be used.

In this second embodiment according to the present invention, display data is separated into a high frequency character writing component, i.e. above four megahertz, and a low frequency positioning component, i.e. below four megahertz, and each is separately stored in display data source 50. When enabled, the high frequency component representing essentially vector slope information is presented to line 52 and a D/A converter 54. The D/A converter 54 changes the digital input signal into an analog equivalent signal respresenting the vector slope or the rate of change of that part of the stroke vector to be displayed by this orthogonal channel. The output of the D/A converter 54 is connected by a line 56 to a scaling impedance, resistor 58, and a summing node 60. From the summing node 60, the signal is presented to the input of a power amplification stage 61.

In the same manner as described heretofore with regard to the basic yoke drive circuit, the summing node 60 is connected by a line 64 to the non-inverting input of an operational amplifier 62. The operational amplifier 62 has a resistor 66 shunted to ground from its inverting input while a resistor 68 is strapped between the inverting input and the amplifier output terminal. The value of resistor 66 and resistor 68 are selected such that the gain around the closed loop is approximately 20.

As before, the output of the operational amplifier 62 is connected to the input of a final amplifier 70. The output signal of the power amplification 61 is connected to one side of winding 72, one of the two windings of the "diddle yoke." A series coupled resistor 74 represents the distributed resistance of winding 72. A sense resistor 76 is shunted from the other side of winding 72 to ground.

Positive feedback is provided by a line 78 connected atop sense resistor 76 which feeds the signal thereon scaled by a resistor 80 to summing node 60. Accordingly, the largest portion of the error causing the high frequency voltage signal presented to magnetic winding 72 to deviate from the perfect integral is minimized, this being the resistive component of the current through winding 72.

The electron beam positional information is often a large amplitude, low frequency signal and with this double winding magnetic deflection yoke configuration, it is handled independently. In its digital form, it is separately stored in the display data source 50. When enabled, the display data source 50 presents this digital signal to line 82 and a D/A converter 84. The D/A converter 84 changes the digital signal to an analog equivalent and presents it to a low frequency yoke driver circuit 86.

The low frequency driver circuit 86 may be of the type generally well known in the art for creating a high current waveform suitable for positioning the electron beam of the CRT. For example, it may comprise a resistor 88 which scales the incoming analog signal prior to being impressed on the inverting input of power operational amplifier 90. The output of the power amplifier 90 is connected to one side of winding 92, which together with winding 72 create the magnetic flux which deflects the electron beam in one orthogonal channel. A sense resistor 94 is shunted to ground from the other side of winding 92. Negative feedback is provided by a resistor 96 connected from atop resistor 94 to the inverting input of amplifier 90. As is known, this negative feedback maintains the low frequency operating characteristics and the D/C stability of low frequency circuit 86 within acceptable limits.

In operation, the high frequency portion of this second embodiment operates in conjunction with the low frequency portion of the embodiment creating a composite magnetic flux for deflection of the CRT electron beam. Electrical isolation of the two portions of this embodiment allows each to be separately matched to differing speed requirements of character generation rather than a single electrical circuit with a wide bandwidth and a high current output. It will be appreciated that positional information has a much lower bandwidth requirement but yet the overall magnetic flux field which must be generated to deflect the electron beam from one extreme on the CRT faceplate to the other extreme is relatively large. Thus, such a rapid movement requires a relatively large current to be forced through the magnetic deflection yoke.

Figure 3:
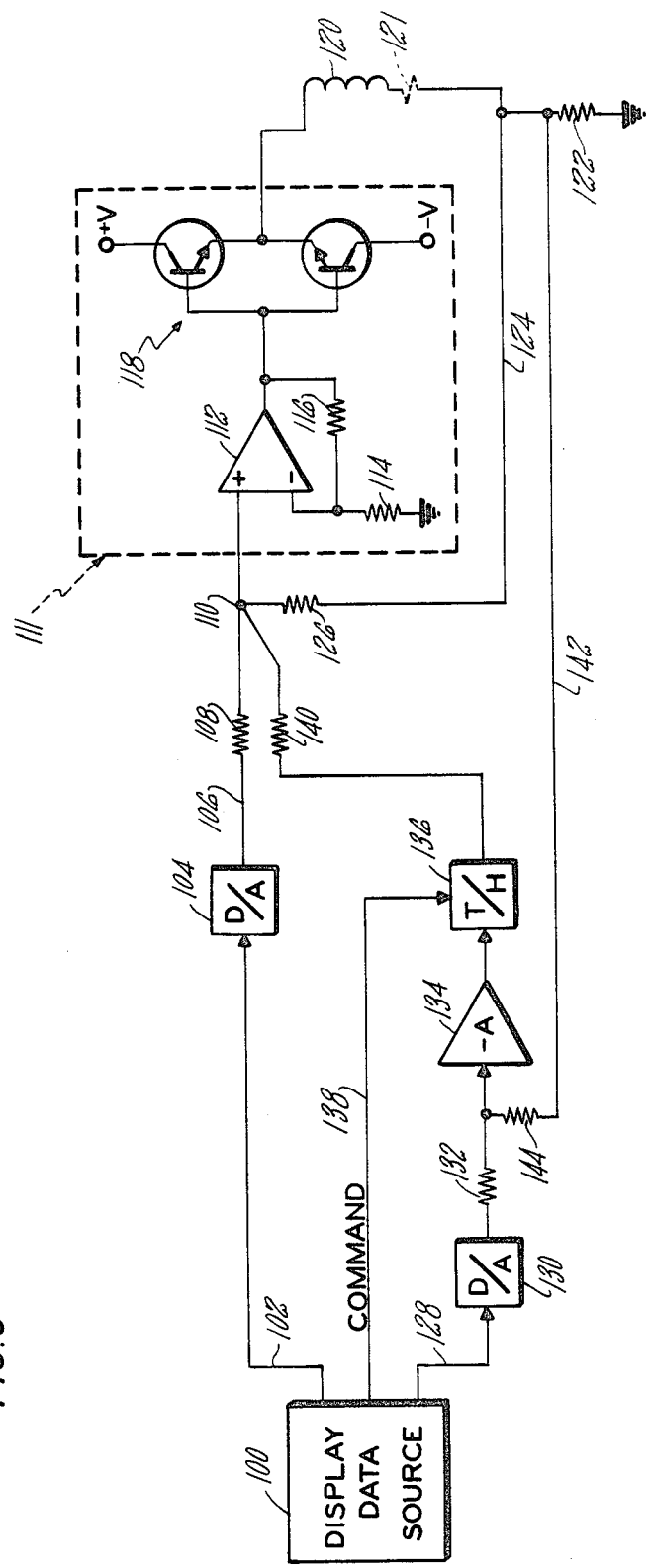
FIG. 3 is a third embodiment of a yoke driver circuit according to the present invention having improved low frequency response based on a time share method of operation.

Finally, referring to FIG. 3, a third embodiment according to the present invention is illustrated. This circuit configuration is suitable for driving a single winding magnetic deflection yoke and yet it has improved DC stability and low frequency response with respect to the basic high speed yoke driver configuration as illustrated in FIG. 1. In this embodiment, display data is also separated into a high frequency character component and a low frequency positioning component, each component being separately stored in a display data source 100. When enabled, video data source 100 presents the high frequency character writing component to line 102 and a D/A converter 104. The D/A converter 104 changes the digital input signal into an analog equivalent signal representing the vector slope or rate of change of that part of the stroke vector to be displayed by this orthogonal channel. The output of the D/A converter is connected by a line 106 to a scaling impedance, resistor 108, and a summing node 110.

As before, the summing node 110 is connected to the input of a power amplification stage 111 which is the non-inverting input of an operational amplifier 112. A resistor 114 is shunted to ground from the inverting input of the operational amplifier 112, while a resistor 116 is strapped between the inverting input and the amplifier output terminal. The value of resistor 114 and resistor 116 are selected such that the loop gain around the closed loop is approximately 20.

The final output waveform of the power amplification stage 11 is provided by a final stage 118 which is connected to one side of magnetic deflection yoke 120. A series coupled resistor 121 represents the distributed resistance of the magnetic deflection yoke. A sense resistor 122 is shunted from the bottom of the magnetic deflection yoke 120 to ground.

In the same manner as heretofore described, positive feedback is provided by a line 124 connected atop sense resistor 122 which feeds the signal thereon scaled by a resistor 126 to summing node 110 of the operational amplifier 112. This positive feedback minimizes the largest single error which causes the high frequency signal presented to magnetic deflection yoke 120 to deviate from the perfect integral.

In this embodiment the position signal, which is often a large amplitude, low frequency signal, is separately stored in display data source 100. When enabled, the display data source 100 presents this digital signal to line 128 and a D/A converter 130. The D/A converter 130 changes the digital signal to an analog equivalent and presents it to the low frequency driver portion of the circuit for positioning the electron beam of the CRT. This low frequency circuit may be a conventional type driver circuit employing an operational amplifier, if it is modified by the addition of an updatable holding device.

For example, in preferred form, the output of D/A converter 130 is coupled to a scaling impedance, resistor 132 for scaling a portion of the incoming analog signal prior to impression on the input of an amplifier 134. The output of amplifier 134 is connected to the input of a T/H (track and hold) circuit 136. In response to a command signal from display data source 100 via line 138, T/H circuit 136 is periodically disposed in one state such that it tracks the signal impressed on its input and presents it to scaling resistor 140 and summing node 110. When in its other state, the output of the T/H circuit 136 retains the last output value corresponding to the input signal value received just before it was switched to its second state. Accordingly, this signal would be presented to summing node 110 until the T/H circuit 136 is once again returned to its first state. By this means the electron beam position is periodically and continuously updated.

From the summing node 110 this signal is continuously fed through the operational amplifier 112 and the power amplifier 118 to create a current waveform through the magnetic deflection yoke 120 for positioning the electron beam. Negative feedback is provided by a line 142 coupled atop sense resistor 122 which senses the yoke driver current therethrough. This feedback path provides a signal scaled by resistor 144 to the input of amplifier 134 for maintaining the low frequency operating characteristics and the DC stability of the low frequency circuit with limits.

All of the embodiments according to the present invention have been described as if there were no significant limitation on the high speed writing capability of the yoke driver circuit. In operation there is a limitation on the speed at which the yoke driver circuit according to the instant invention can produce a stroke on the CRT faceplate which is acceptably proportional to the input signal. This is because the assumptions which resulted in the mathematical equation for the voltage across the magnetic deflection yoke must be augmented by additional terms. The major high speed limitation is as a result of the parasitic capacitance, i.e. the capacitance between the adjacent loops of the winding in the magnetic deflection yoke itself. This capacitance creates a current which acts in opposition to the inductive current such that the yoke is no longer a perfect inductance. Accordingly, one method to compensate for this high speed limitation is by rolling off the high frequency response characteristic at some point, with a high frequency filter connected in parallel with the sense resistor. This shunts the high frequency capacitive current to ground and prevents it from adding to the positive feedback supplied to the summing node.

Although the invention has been shown and described with respect to the preferred embodiments thereof, it should be understood by those skilled in the art that the foregoing and various changes and omissions in the form and detail thereof may be made therein without departing from the spirit and the scope of the invention.

Having thus described typical embodiments of my invention, that which I claim as new and desire to secure by Letters Patent of the United States is:

1. A driver circuit for the deflection system of a CRT, said deflection system including the magnetic deflection yoke with at least a pair of windings which create co-acting magnetic flux fields, at least one winding including a sense resistor for shunting the yoke current to ground; comprising:

a high speed means for receiving a high frequency analog information, and having an output for coupling to one winding of said magnetic yoke, said winding being coupled to a sense resistor, including:
combining means having at least a first and second input and, in operation, adding the signals impressed thereon, and having an output;
power amplifier means coupled to said output of said combining means, for providing a signal to said winding of said magnetic deflection yoke; and,
feedback means for sensing the current flowing through said sense resistor and for feeding back a signal which is proportional to the current through said winding to said second input of said combining means; and
a low speed means for receiving low frequency information including an output for coupling to said other winding of said magnetic deflection yoke, said low speed means creating a signal waveform suitable for generating a positioning magnetic flux field proportional to the input signal impressed thereon.

2. Apparatus according to claim 1, wherein said yoke drive circuit is adapted to be used in conjunction with one orthogonal channel of a stroke-write system suitable for displaying alphanumeric characters, and wherein said first input of said combining means receives, in operation, a signal substantially corresponding to the slope of a vector to be displayed on said CRT.

3. Apparatus according to claim 1, wherein said magnetic deflection yoke comprises a pair of deflection yokes, each connected to a sense resistor and each independently actuable to deflect the electron beam of said cathode ray tube in one orthogonal direction, and wherein said driver circuit includes a high speed portion with a wide bandwidth for linearly deflecting said electron beam in response to a slope vector signal and wherein said yoke drive circuit further includes a low speed portion for deflecting the electron beam of said cathode ray tube in response to position information.

4. Apparatus according to claim 1 wherein said driver circuit has a high speed portion capable of linearly deflecting the electron beam in response to a slope signal waveform applied to said first input of said combining means and wherein said driver circuit further includes a low speed portion coupled to a third input of said combining means for periodically presenting low speed or positional signals thereto.

5. A driver circuit for the deflection system of a CRT said deflection system including a magnetic deflection yoke coupled in series with a sense resistor for shunting the yoke current to ground, comprising:
a high speed means for receiving a high frequency analog signal, and having an output for coupling to said magnetic deflection yoke, including:
combining means having at least a first input for receiving said high frequency analog signal, a second input, and a third input, and, in operation, combining the signals impressed thereon, and having an output,
power amplifier means coupled to said output of said combining means, for providing a signal waveform suitable for driving magnetic deflection yoke including an output adapted to be connected to said magnetic deflection yoke, and
feedback means for sensing the current flowing through said sense resistor and for feeding back said signal proportional to the rate of change of current through said magnetic deflection yoke to said second input of said combining means, and
a low speed means for receiving a low frequency analog signal, including a bimodal means having an input and an output connected to said third input of said combining means, and being periodically actuated by a gate signal so that in a first state the signal on said output is directly proportional to said input signal, and in a second state having an output signal proportional to the last received signal in said first state.

6. Apparatus according to claim 5, wherein said yoke drive circuit is adapted to be used in conjunction with one orthogonal channel of a stroke-write system suitable for displaying alphanumeric characters, and wherein said first input of said combining means receives, in operation, a signal substantially corresponding to the slope of a vector to be displayed on said CRT.

7. Apparatus according to claim 5, wherein said magnetic deflection yoke comprises a pair of deflection yokes, each connected to a sense resistor and each independently actuable to deflect the electron beam of said cathode ray tube in one orthogonal direction, and wherein said driver circuit includes a high speed portion with a wide bandwidth for linearly deflecting said electron beam in response to a slope vector signal and wherein said yoke drive circuit further includes a low speed portion for deflecting the electron beam of said cathode ray tube in response to position information.

8. Apparatus according to claim 5, wherein said driver circuit has a high speed portion capable of linearly deflecting the electron beam in response to a slope signal waveform applied to said first input of said combining means and wherein said driver circuit further includes a low speed portion coupled to a third input of said combining means for periodically presenting low speed or positional signals thereto.

* * * * *

UNITED STATES PATENT AND TRADEMARK OFFICE
CERTIFICATE OF CORRECTION

PATENT NO. : 4,142,134
DATED : February 27, 1979
INVENTOR(S) : Glenn C. Waehner

It is certified that error appears in the above-identified patent and that said Letters Patent are hereby corrected as shown below:

In the Abstract, line 11, change "connected" to --corrected--.

In the Abstract, line 14, change "within" to --with--.

Column 4, line 47, change "di/di" to --di/dt--.

Column 4, line 56, change "resistance" to --resistive--.

Column 7, line 41, change "ll" to --lll--.

Column 10, line 16, delete "rate of change of".

Signed and Sealed this

Twenty-sixth Day of June 1979

[SEAL]

Attest:

RUTH C. MASON
Attesting Officer

DONALD W. BANNER
Commissioner of Patents and Trademarks